United States Patent [19]

Celler et al.

[11] 4,406,709
[45] Sep. 27, 1983

[54] METHOD OF INCREASING THE GRAIN SIZE OF POLYCRYSTALLINE MATERIALS BY DIRECTED ENERGY-BEAMS

[75] Inventors: George K. Celler; Harry J. Leamy, both of Summit; Lee E. Trimble, Hillsborough, all of N.J.

[73] Assignee: Bell Telephone Laboratories, Incorporated, Murray Hill, N.J.

[21] Appl. No.: 276,932

[22] Filed: Jun. 24, 1981

[51] Int. Cl.³ .................................... H01L 21/263
[52] U.S. Cl. ................................. 148/1.5; 29/576 B; 136/258; 148/187; 156/620; 357/91; 427/53.1
[58] Field of Search ............... 148/1.5, 187; 136/258; 427/53.1; 357/91; 156/620; 29/576 B

[56] References Cited

U.S. PATENT DOCUMENTS 4,234,356 11/1980 Auston et al. ........................ 148/1.5
4,234,358 11/1980 Celler .................................. 148/1.5
4,309,225 1/1982 Fan et al. ............................. 148/1.5
4,330,363 5/1982 Biegesen ............................. 156/620

OTHER PUBLICATIONS

Maserjian, Solid State Electronics, vol. 6, 1963, pp. 477-484.
Gibbons in Proceedings of the Symposium on Laser and Electron Beam Processing of Electronic Materials, *The Electrochem. Soc., Princeton*, vol. 80—1, 1980, pp. 1-25.
Biegelson et al. in Laser—Materials Processing, Elsevier North Holland Publishing Co., 1981, p. 487, Ed. Gibbons et al.
Williams et al., Appl. Phys. Letts., 33, (1978), 542.
Murakami et al., Appl. Phys. Letts., 35, (1979), 628.
Gat et al., Appl. Phys. Letts., 33, (1978), 775.

*Primary Examiner*—Upendra Roy
*Attorney, Agent, or Firm*—Samuel H. Dworetsky

[57] ABSTRACT

Crystal grain size in a material is increased by scanning the material with an appropriately directed energy beam. Short-term oscillation in the scan, and a particular temperature gradient configuration in the wake of the scan, results in growth of large-grain crystallites.

16 Claims, 7 Drawing Figures

METHOD OF INCREASING THE GRAIN SIZE OF POLYCRYSTALLINE MATERIALS BY DIRECTED ENERGY-BEAMS

BACKGROUND OF THE INVENTION

1. Technical Field

This invention involves techniques for increasing the grain size of polycrystalline materials especially with a view toward improving the device-worthy characteristics of thin semiconductor films.

2. Disclosures of Interest

With the development of evermore sophisticated integrated circuitry and the concomitant heavy reliance on MOS-related technology, the use of thin film semiconductors on insulating substrates promises to become a preferred alternative to the current bulk semiconductor configuration. The insulating substrate, which is usually amorphous, provides dielectric isolation thereby lowering deleterious capacitive coupling, providing enhanced radiation tolerance, and removing CMOS latchup. Further advantages accrue when the insulating dielectric is a thin film and is placed over a conducting substrate. This latter configuration, of a thin film semiconductor on a thin dielectric all over a conducting substrate, results in a well-placed ground plane further improving device-worthy characteristics.

While the most sophisticated devices using semiconductor-insulator-conductor configurations require single crystal semiconductors, it has recently become apparent that large-grained polycrystalline semiconductor is adequate for many device applications. However, preferred CVD deposition of semiconductor material on an insulating substrate results in a fine-grained polycrystalline structure yielding slow devices due to the lowered mobility associated with numerous grain boundaries. Nevertheless, it has recently been shown that various techniques may be used to increase the grain size of the CVD deposited polycrystalline material to a level which would render the material satisfactory for many device applications.

Initial studies on increasing grain size of polycrystalline materials involved the use of scanning electron beams (J. Maserjian, *Solid State Electron,* 6, 477 (1963)). While such studies indicated that significant increase in grain size can be obtained, there was no clear indication that device-worthy characteristics would thereby result. Later studies on the possibility of increasing grain size through the use of laser scanning, similarly, did not emphasize the device applications to which the process might be applied. Recently, however, Gibbons has shown that scanning a fine-grained polycrystalline semiconductor with an appropriate laser would result in increased grain size to the point that device-worthy characteristics could be obtained. (*Laser and Electron Beams Processing of Electronic Materials,* Vol. 80-1, The Electrochemical Society, Princeton, N. J., 1980, pp. 1–25.) This work has been carried further by D. K. Biegelsen et al with the use of a scanning laser whose spot is imaged into a "crescent" configuration (*Laser and Electron Beam Solid Interaction and Materials Processing,* Gibbons et al, eds., Elsevier North Holland Publishing Co., 1981, p. 487). Biegelsen and his coworkers claim that further enhancement in grain size could be obtained using this configuration.

SUMMARY OF THE INVENTION

The invention is a method of forming large-grain crystallites, generally with at least one dimension greater than 10 or 25 microns, in a material, which in exemplary embodiments, may be amorphous or fine-grained polycrystalline. In the inventive method the material is exposed to a scanning beam of directed energy such as, for example, a laser beam, an electron beam, a positive ion beam or a neutral particle beam. Two elements of the scanning configuration account, in part, for the exceptionally large crystallites which result. First, local elements of the material are repetitively heated, and allowed to cool, at least somewhat, to stimulate large-grain growth. The repetitive heating and cooling is effected, for example, by superimposing a short-term local oscillating scan on the long-term advancing motion of the beam. The short-term local oscillatory motion has time-space characteristics which yield the desired repetitive heating and cooling.

A second element of the scan which accounts for large-grain growth involves the use of a scanning configuration which sets up in the wake of the long-term advance of the beam, a cooler-to-hotter temperature gradient which points away from the direction of the long-term advance of the beam. Since crystal growth generally occurs along the steepest temperature gradients, this configuration results in essentially single crystal material in the vicinity of the axis of the long-term advance of the beam. These two elements of the inventive scanning technique, in part, account for the growth of large crystallites in the wake of the scanning beam.

The invention, in exemplary embodiments, may be applied to the growth of large semiconductor crystallites for subsequent semiconductor processing as part of electronic device fabrication. The scanning beam may be an appropriate laser beam of wavelength such that the semiconductor material can absorb energy from the beam with a concomitant drastic change in diffusion characteristics of the material. This change in diffusion characteristics allows for crystal growth. In most embodiments, the absorption from the beam will be of such magnitude that the material will locally melt, resolidify and then remelt as a result of the oscillatory motion of the beam.

Appropriate temperature gradients useful in the practice of this invention may be obtained by defining a Lissajous figure, or part of a Lissajous figure, on the semiconductor material, with the energy beam. The figures which are most desirable will have an associated concave portion at the trailing edge of the scan. This will provide requisite temperature gradients for crystal growth with essentially no grain boundaries in the central wake of the beam scan.

DETAILED DESCRIPTION

The invention is an improved technique for increasing the grain size of polycrystalline material by appropriately exposing the material to energy which stimulates grain growth. Such energy may be in the form of electron, proton or neutral particle beams, focused light beams or beams of coherent electromagnetic energy such as laser beams. The energy, when at least partially absorbed by the material, results in increased grain size.

Figure 1:
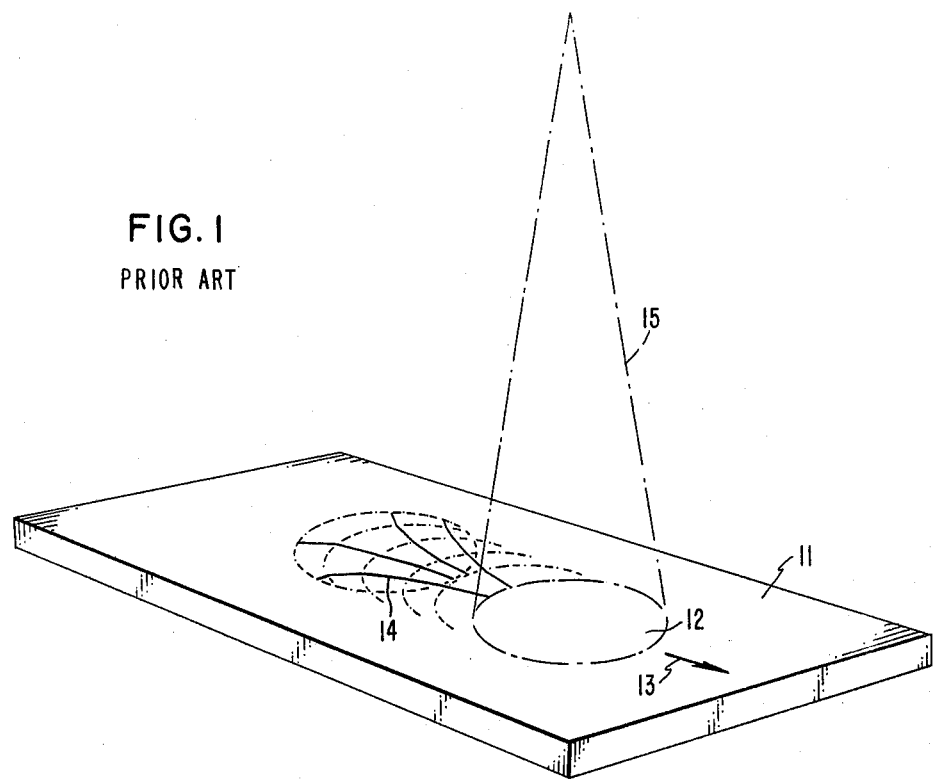
FIG. 1 is a schematic representation of an illumination configuration used in a prior art technique for increasing grain size in polycrystalline materials.

FIG. 1 is a schematic representation of an illumination pattern used in prior art techniques for increasing grain size in polycrystalline material. In this Figure, 11 is a substrate of polycrystalline material such as fine-grained CVD deposited semiconductor whose grain size the practitioner desires to increase. 12 is the illumination spot resulting when the substrate 11 is exposed to an appropriate directed energy beam, such as for example, a laser beam, 15, of wavelength which is absorbed by the material. 13 represents the direction of relative travel of the exemplary laser beam. (As in the following figures the scan pattern is expanded for clarity.) Irradiation by the beam 15 results in absorption of energy by the material, usually to the point of local melting. Larger grain sizes appear upon resolidification. Since grain growth generally occurs along the steepest temperature gradient, grain boundaries resulting from this irradiation configuration will be as represented by 14. It should be noted that as a result of this grain growth numerous grains and grain boundaries are left in the wake of the traversing spot resulting in only limited increase in grain size.

Figure 2:
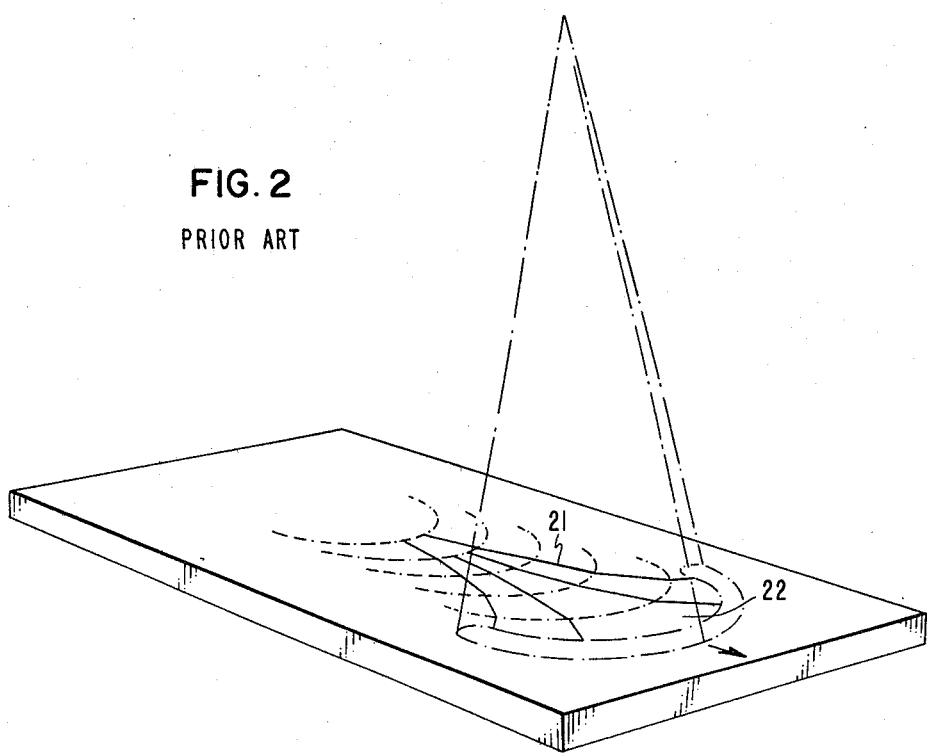
FIG. 2 is a schematic representation of an improved prior art illumination configuration for increasing grain size of polycrystalline materials.

In FIG. 2 an alternative prior art illumination configuration is shown which results in further increased grain size. In this Figure, the radiation pattern is in the form of a "crescent" with the concave portion of the crescent defining the trailing edge of the illumination pattern. Since grain growth is in the direction of steepest thermal gradients, grain growth will be as shown by 21, and hence a region 22 of essentially single grain material will result from this illumination pattern.

Figure 3:
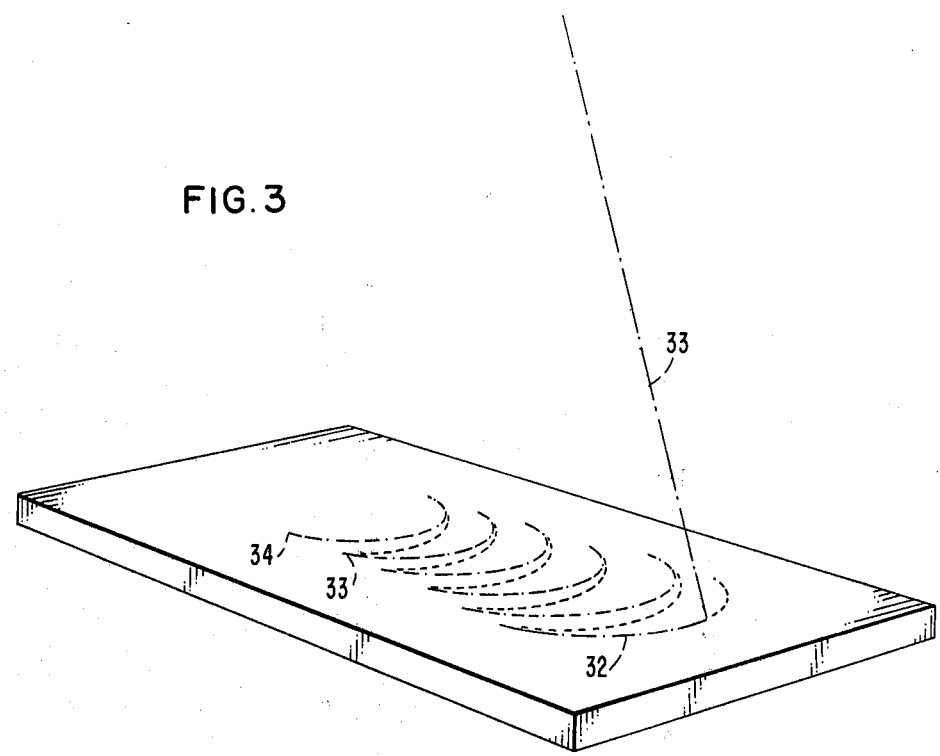
FIGS. 3, 4, 5 and 6 are embodiments of the inventive technique for increasing grain size in polycrystalline materials.

However, an oscillatory pattern is most preferable in further increasing grain size above and beyond that obtained using illumination configurations as in FIGS. 1 and 2. It should be noted that numerous grain boundaries with associated small grain size, in fact, represents a relatively high energy state. Grain boundaries are therefore the first to melt if heated, and if allowed to equilibriate, such as by exposure to an oscillatory illumination pattern, the material preferably approachs a configuration with fewer grain boundaries and larger grain sizes (K. A. Jackson et al, *Journal of Crystal Growth*, 42, 364 (1977)). Applicants therefore suggest a scanning configuration as shown in FIG. 3. Here, the beam, 33, is relatively scanned, over the long term, in a direction shown by 32. The rate of scan of the beam is such that the material, when illuminated, has significantly increased diffusion characteristics and may, in fact, be rendered molten. However, by the time the beam returns to any given point such as 33 near an earlier position, 34, the material has either returned close to its original diffusion characteristics or, for example, has resolidified. This repetitive melting and refreezing allows the material to more closely approach the desired equilibrium of larger grain size and fewer grain boundaries. The pattern shown in FIG. 3 also results in a concave beam wake which, as discussed above, contributes to increased grain size by appropriate alignment of temperature gradients.

Since in the embodiment of FIG. 3 the beam spends more time at the edges of the scan pattern, material in this vicinity may be physically damaged due to exposure to high amounts of energy. To avoid this, the beam power may be lowered at the edges of the scan. Alternatively, scanning configurations, such as that shown in FIG. 4, may be used where ellipses are formed on the material substrate with the laser beam shut for one-half of the scan as shown by the dashed line. This results in no increased residence time at the edges, and hence avoids the damage problem which may be encountered when the scan of FIG. 3 is used. An alternative scanning configuration is shown in FIG. 5.

Figure 4:
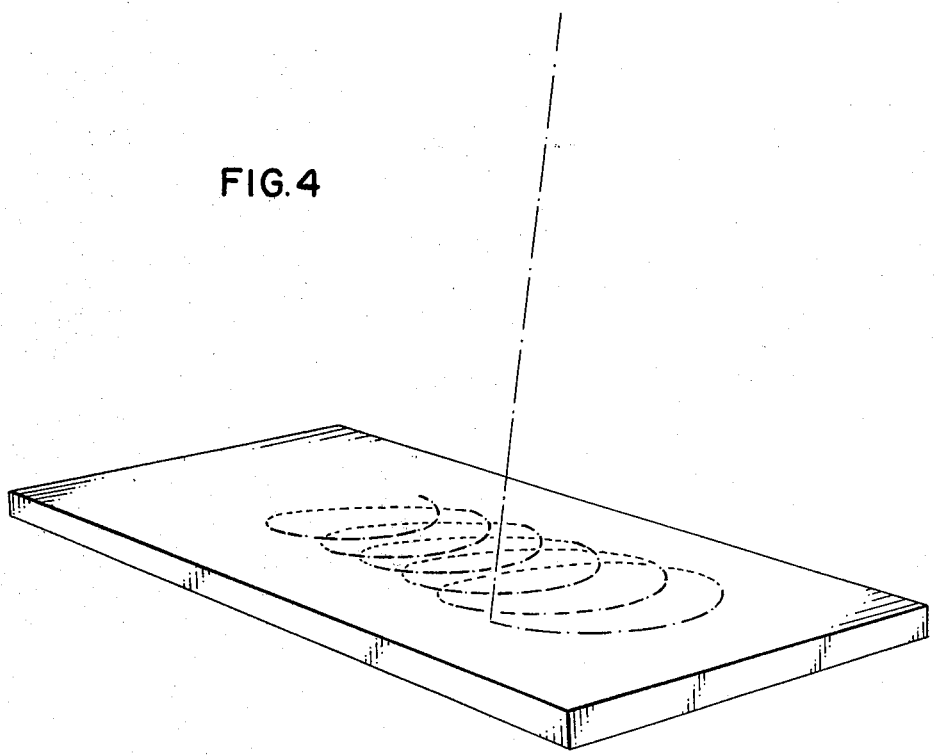
Figure 5:
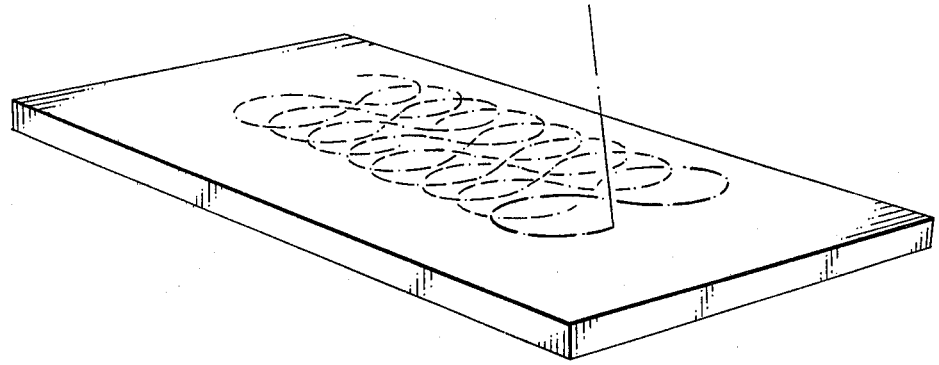
Figure 6:
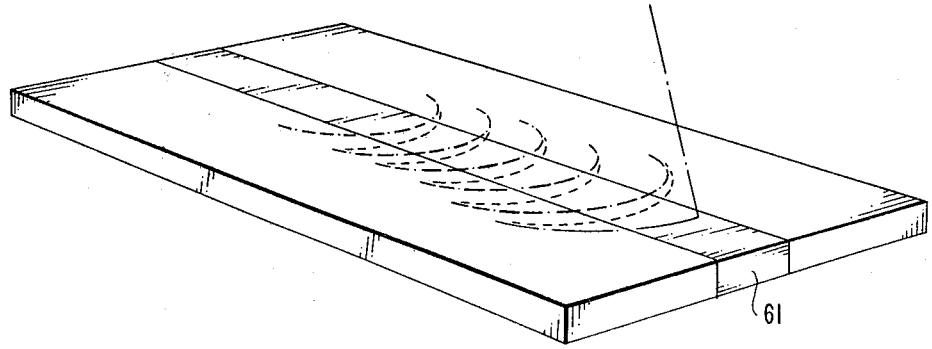

Despite the alternative scanning configurations of FIGS. 3-5, it is clear from FIG. 2 that the material at the edges of the scan will have less desirable grain characteristics than the material in the center of the scan. To avoid this "edge effect", configurations such as FIG. 6 may be employed. In this configuration the scan width is greater than the width of the material to be processed 61 and consequently the entire polycrystalline material, 61, is rendered single crystalline.

Figure 7:
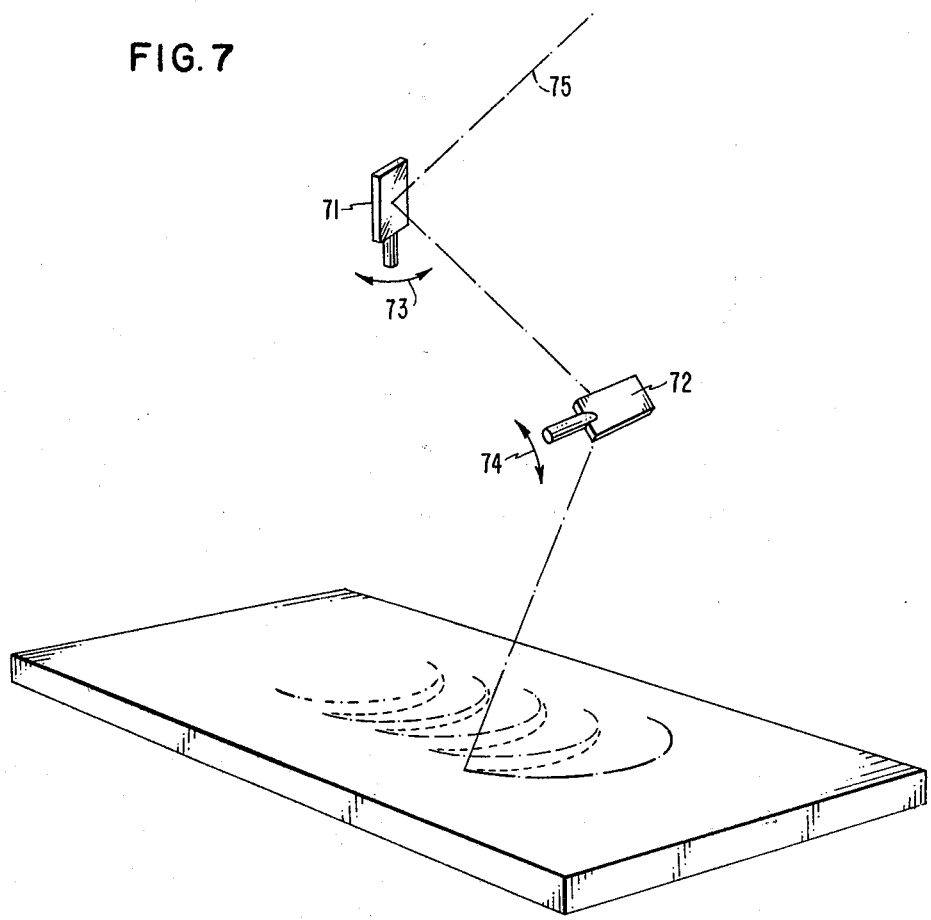
FIG. 7 is a specific apparatus for practicing this invention.

While the scanning configuration suggested in FIGS. 3-6, and other configurations which fall within the spirit of this invention, may be easily obtained by those skilled in the art, a suggested method for scanning a laser so as to obtain these patterns is shown in FIG. 7. In this Figure, 71 and 72 are mirrors which can rotate about axes perpendicular to each other as shown in 73 and 74. 75 is an exemplary laser beam which, as a result of appropriate rotation of the two mirrors 71 and 72, will describe a spot traversal of any particular desired configuration.

With the above introduction to the invention, further details may be provided to enhance the practitioner's appreciation for the advance in the art which this invention represents.

1. Scan Configuration

The inventive scan configuration is stimulated by the desire to obtain a large-grained crystal in the wake of the scan. Clearly, useful practice of the invention will accrue from any increase in grain size of the material being irradiated. However, in most embodiments grain sizes with at least one dimension greater than 10 microns, or perhaps 25 microns, will be obtained. Grain sizes with dimensions greater than 100 or 500 microns may also be obtained. Generally, the length of the newly grown grain will be limited only by the length of the scan and may be many hundreds of microns long. The width of the newly grown grain likewise will be limited in the first instance by the width of the scan.

The scanning configuration generally will be characterized by at least two specific properties. Firstly, the scanning motion will have a relatively high velocity, short-term, local, oscillatory pattern which will result in repetitive growth of crystals in the material. For example, the beam may oscillate locally about a given point resulting in repetitive melting, resolidification and remelting of the given point. Such processing by itself will result in some increase in grain size.

Superimposed upon this first requirement is a second characteristic related to temperature gradients in the wake of the term advance of the beam. The scanning configuration is such that in the wake of the long-term scanning pattern cooler-to-hotter temperature gradients are set up which are pointed away from the axis of the long-term motion. This results in grain boundaries only in the vicinity of the boundaries of the long-term irradiation pattern. One particular pattern which will result in preferred temperature gradients involves a "crescent-type" figure with the concave portion of the "crescent" defining the wake of the long-term scanning pattern, as in FIGS. 2-6. However, it should be noted that the essence of this aspect of the invention is independent of the particular scanning pattern and requires only that appropriate temperature gradients be set up in the wake of the scan.

Particular embodiments which are characterized by the above-discussed scanning characteristics involve the use of Lissajous figure scans. In such embodiments, the short-term oscillatory motion comprises two perpendicular, and usually sinusoidal motions with periods which are integral multiples of each other. The phase between the two motions is independently variable. As is well known in the art, when the periods of the two motions are in a ratio of 2-1 such combined motion results in the tracing of a characteristic figure eight pattern with various degrees of distortion depending upon the phase value and amplitude difference between the two oscillatory motions. These figures will have the requisite temperature gradients formed in at least a portion of their wake as shown in the FIGS. As is well known to those skilled in the art such Lissajous figures may be traced with a laser beam through the use of for example, two mirrors which may be oscillated about perpendicular axes of rotation, as shown in FIG. 7.

The requisite energy of the beam is a function of the nature of the beam and the substrate material. In the first instance, energy requirements are dictated by the need to have the material absorb at least part of the energy so as to have diffusion characteristics changed thereby allowing for crystal growth. Generally, material characteristics will be changed to the point where melting occurs. However, even if melting does not occur, the technique may be practiced within the spirit of this invention since under certain circumstances new crystal growth may conceivably occur even in the absence of melting as long as diffusion characteristics are sufficiently altered. Appropriate energy beams will include electron beams, ion beams, neutral particle beams, focused light beams and coherent light beams such as lasers. The wavelength of the light beams will also be dictated by the desire to have the material absorb at least part of the beam energy and hence may vary depending upon the type of material being used. The material may be heated during processing to enhance energy absorption or to allow for the use of lower energy beams.

2. Material Considerations

While the inventive process may be applied to any type of material where increased grain size is desired, most applications of this invention will involve semiconductor processing. Applications will include the fabrication, for example, of solar cells and of integrated circuits. Semiconductors to which this invention may be applied will include Type IV semiconductors, Type III-V compound semiconductors and Type II-VI compound semiconductors including ternary and quaternary compounds. Exemplary of such materials are silicon, germanium, gallium arsenide, gallium phosphide, cadmium sulphide, indium phosphide and indium antimonide. Specific material configurations will be dicated by subsequent applications of the processed semiconductor material. Generally, the process will be applied to thin film semiconductors of thickness less than 10 microns or even 2 microns. Particularly desirable configurations may involve semiconductor thin films placed on insulators, and other embodiments where both the semiconductor film and an insulating film are together placed on a conductor such as a metal or a semiconductor. The semiconductor material to be processed may be advantageously capped, with the cap transparent to the energy beam necessary for processing.

3. Further Processing

Clearly, the invention does not limit the nature of further processing subsequent to large-grain crystal growth. One particular embodiment would involve the use of the large-grain material as a seed in further crystal growth. Such further crystal growth may proceed by any technique available to the practitioner in the art but may advantageously involve irradiating the material with a directed beam of energy such as, for example, in laser annealing processing, where the large-grain crystal would be used as a seed for further growth (see for example, U.S. Pat. No. 4,234,358).

EXAMPLE 1

In this example, a layer of polycrystalline silicon was irradiated with laser light to increase its grain size. The polycrystalline silicon was formed by low pressure chemical vapor deposition at about 625 degrees Celsius. A 0.6 micron layer was deposited on a 1 micron amorphous silicon dioxide substrate. The amorphous silicon dioxide substrate was grown by wet oxidation of a silicon wafer. The entire wafer, both the amorphous substrate and the polycrystalline CVD layer, was thermally heat treated in a nitrogen environment at 1100 degrees Celsius for one-half hour to render the material more resistant to laser damage. During irradiation, the sample was held on a vacuum chuck and was heated to 400 degrees Celsius. Heating the substrate during processing reduces the amount of laser power needed in the inventive processing and also limits thermal stress effects in the film. The chuck is placed on a computer-controlled XY table for ease of relative motion between the beam and the sample. Dry nitrogen may be flowed past the substrate surface so as to minimize thermal distortion of the laser beam associated with heating of the substrate.

The sample is irradiated with a multi-lined argon laser, typically between 12 and 20 watts, focused to approximately a 50 micron spot size with a 20 centimeter focal length lens. Before reaching the focusing lens, the beam is reflected off two galvanometer-controlled mirrors rotatable about axes which are normal to each other. The scan associated with motion of one mirror is perpendicular to the motion of the table upon which the substrate is placed, while the scan associated with the other mirror is parallel to the motion of the table upon which the substrate is placed.

Appropriate control of the two mirrors allows the practitioner to define a Lissajous figure on the substrate with the focused laser spot. For the Lissajous figures used here, the frequency of oscillation of the mirror which provided a scan parallel to the table motion was twice the frequency of the oscillation of the mirror which provided scan normal to the motion of the table. In such a case, and depending upon the phase between the two mirror motions, the Lissajous figure may vary from crescent-shape to figure eight shape.

In a specific example, the linear velocity of the table was 0.5 centimeters per second, the amplitude of the oscillation of the spot in a direction perpendicular to the table motion was approximately 300 microns, and the amplitude in the perpendicular direction was 75 microns. The sinusoidal mirror oscillation frequencies were 700 and 1400 per second, respectively. The phase shift between the two mirror motions was 80 degrees from that which would provide for a perfect figure eight. In this specific example, the laser power was set at 17 watts.

This processing results in a single crystalline track approximately centered about the axis of advance of the Lissajous figure, about 40-50 microns wide and a few hundred microns long. Best results are obtained where the trailing edge of the figure tends to be wedge-shaped, which is a consequence of having a phase angle intermediate between the figure eight and the crescent. Increasing the amplitude of oscillation during processing results in an ever-increasing Lissajous figure with an ever-increasing single crystal width. Adjustment of the beam power to maintain material temperatures during processing may be desirable in such embodiments.

What is claimed is:

1. A method of forming crystallites in a material comprising
   scanning relatively a directed energy beam across the material with a scanning pattern that has
   (1) a local, higher velocity, short-term, oscillatory motion such that local portions of the material are repetitively heated and allowed to cool, and
   (2) a slower velocity, longer term, motion which results in long-term advance of the beam across the material,
   the scanning pattern resulting in cooler-to-hotter temperature gradients in the wake of the long-term advancing motion which point away from the direction of the long-term advancing motion,
   such that a crystallite grows along the direction of the long-term advancing motion.

2. The method of claim 1 wherein the material is a semiconductor.

3. The method of claim 2 wherein the semiconductor is selected from the group consisting of Group IV materials, Group III-V compound materials and Group II-VI compound materials.

4. The method of claim 3 wherein the material is silicon or germanium.

5. The method of claim 3 wherein the material is gallium arsenide, indium antimonide, indium phosphide, or cadmium sulphide.

6. The method of claim 5 wherein the semiconductor is located over an insulating material.

7. The method of claim 6 wherein the insulating material is less than 50 microns thick.

8. The method of claim 7 wherein the insulator is silicon dioxide.

9. The method of claim 8 wherein the insulator is located over a metal or a semiconductor material.

10. The method of claim 1 wherein the higher velocity motion is a combination of two oscillatory motions approximately perpendicular to each other, the period of one of the oscillatory motions being approximately an integer multiple of the period of the second oscillatory motion, the phase lag between the two motions being independently variable.

11. The method of claim 10 wherein the amplitude of at least one of the two oscillatory motions is increased during the scan such that both dimensions of the large-grain which is grown during the process increase during processing.

12. The method of claim 9 wherein the semiconductor is capped with a material transparent to the energy beam.

13. The method of claim 12 wherein subsequent to scanning the large-grain crystallite is used to seed further crystal growth.

14. The method of claim 13 wherein the further crystal growth is stimulated by exposing the material to a scanning energy beam.

15. The method of claim 1 wherein the energy beam is a laser, electron, positive ion, or neutral particle beam.

16. The method of claim 1 wherein the beam power is varied during processing.

* * * * *